(12) United States Patent
Rohleder et al.

(10) Patent No.: US 9,847,258 B2
(45) Date of Patent: Dec. 19, 2017

(54) PLASMA DICING WITH BLADE SAW PATTERNED UNDERSIDE MASK

(71) Applicant: NXP B.V., Eindhoven (NL)

(72) Inventors: Thomas Rohleder, Hamburg (DE); Hartmut Buenning, Hamburg (DE); Guido Albermann, Hamburg (DE); Sascha Moeller, Hamburg (DE); Martin Lapke, Hamburg (DE)

(73) Assignee: NXP B.V., Eindhoven (NL)

( * ) Notice: Subject to any disclaimer, the term of this patent is extended or adjusted under 35 U.S.C. 154(b) by 20 days.

(21) Appl. No.: 14/871,482

(22) Filed: Sep. 30, 2015

(65) Prior Publication Data

US 2017/0092540 A1  Mar. 30, 2017

(51) Int. Cl.

| | | |
|---|---|---|
| H01L 21/00 | (2006.01) |
| H01L 23/544 | (2006.01) |
| H01L 21/82 | (2006.01) |
| H01L 21/3065 | (2006.01) |
| H01L 21/304 | (2006.01) |
| H01L 21/311 | (2006.01) |
| H01L 21/66 | (2006.01) |
| H01L 27/04 | (2006.01) |
| H01L 23/528 | (2006.01) |
| H01L 21/78 | (2006.01) |

(52) U.S. Cl.
CPC ............ *H01L 21/82* (2013.01); *H01L 21/304* (2013.01); *H01L 21/3065* (2013.01); *H01L 21/31111* (2013.01); *H01L 21/78* (2013.01); *H01L 22/12* (2013.01); *H01L 23/528* (2013.01); *H01L 27/04* (2013.01)

(58) Field of Classification Search
CPC ....... H01L 21/78; H01L 21/82; H01L 21/304; H01L 21/3065; H01L 22/12
USPC .......... 257/620, E21.599, E21.602, E21.218; 438/460, 464, 465, 113, 114
See application file for complete search history.

(56) References Cited

U.S. PATENT DOCUMENTS

| | | | |
|---|---|---|---|
| 6,465,158 B1 * | 10/2002 | Sekiya ................ H01L 21/3043 |
| | | | 257/E21.238 |
| 2003/0190770 A1 * | 10/2003 | Yeom ...................... C30B 29/20 |
| | | | 438/113 |

(Continued)

OTHER PUBLICATIONS

Laerme, F., et al. "Bosch Deep Silicon Etching: Improving Uniformity and Etch Rate for Advanced MEMS Applications", IEEE Intl. Conf. on Micro Electro Mechanical Systems, pp. 211-216 (Jan. 1999).

(Continued)

*Primary Examiner* — Fernando L Toledo
*Assistant Examiner* — Aaron Gray

(57) ABSTRACT

Consistent with an example embodiment, there is a method for preparing an integrated circuit (IC) device from a wafer substrate, the wafer substrate having a top-side surface with a plurality of active device die separated by saw lanes and an opposite under-side surface. The method comprises coating the under-side surface of the wafer substrate with a resilient coating, locating the position of the saw lanes from the underside surface, blade dicing trenches in the resilient material to expose under-side bulk material in the position of saw lanes, and plasma etching through the trenches to remove the exposed under-side bulk material.

14 Claims, 3 Drawing Sheets

(56) References Cited

U.S. PATENT DOCUMENTS

2006/0166465 A1* 7/2006 Ono .................. H01L 21/78
438/460
2010/0120230 A1* 5/2010 Grivna ............... H01L 21/78
438/464

OTHER PUBLICATIONS

Disco Corp., "Plasma Solution in Disco, Operation V tabu", pp. 1-19 (Apr. 14, 2015).
Fornaroli, C. et al. "Dicing of Thin Si Wafers with a Picosecond Laser Ablation Process", Physics Procedia, vol. 41, pp. 603-609 (2013).
Runhui Huang et al. "Plasma Etch Properties of Organic BARCs", Proc. SPIE, vol. 69232G, pp. 1-9 (Mar. 26, 2008).
Hirscher, H. et al. "Thin Wafer Processing", Solid State Technology (Insights for Electronics Manufacturing), 6 pgs., retrieve from Internet at: http://electroiq.com/blog/2009/03/thin-wafer-processing/ (Sep. 21, 2015).

* cited by examiner

PLASMA DICING WITH BLADE SAW PATTERNED UNDERSIDE MASK

FIELD

This disclosure relates to integrated circuit (IC) manufacturing. More particularly, this disclosure relates to the separation of IC devices from a wafer substrate.

BACKGROUND

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

The electronics industry continues to rely upon advances in semiconductor technologies to realize higher-function devices in more compact areas. Applications realizing higher-functioning devices require integrating a large number of electronic devices into a single silicon wafer. As the number of devices per given area of the silicon wafer increases, the manufacturing process becomes more difficult.

After manufacturing, the wafer containing from hundreds to thousands of device die, has to be diced up into individual active devices. There is a need for a process that efficiently can perform the dicing process to maintain acceptable yields and contain costs.

SUMMARY

Embodiments in the present disclosure has been found useful in preparing a wafer substrate, containing active device die, to obtain individual product die with reduced damage on their vertical sidewalls, and edges. The technique is a combination of blade dicing and plasma etching. To properly apply the plasma etching, a mask is patterned on an underside of the wafer substrate. The mask is a resilient material. With a dicing blade, in areas corresponding to saw lane locations, cuts are made through the resilient material to expose substrate material. With a suitable plasma chemistry, the exposed substrate material is etched through so that the active device die may be separated into individual product devices. Vertical sidewalls of the individual product die would exhibit characteristics of blade dicing and plasma etching.

Consistent with an example embodiment, there is a method for preparing an integrated circuit (IC) device from a wafer substrate, the wafer substrate having a top-side surface with a plurality of active device die separated by saw lanes and an opposite under-side surface. The method comprises coating the under-side surface of the wafer substrate with a resilient material, locating the position of the saw lanes from the underside surface, blade dicing trenches in the resilient material to expose under-side bulk material in the position of the saw lanes, and plasma etching through the trenches to remove the exposed under-side bulk material, the plasma etching thereby producing an etch profile characteristic of a plasma etch process.

Consistent with another example embodiment, an integrated circuit (IC) device die comprise, a top-side portion of the device with circuit elements, surrounded by a saw lane boundary, and having a depth of at least a thickness of inter-metal dielectric (IMD) layers, an under-side portion of bulk material extending from the IMD layers to an underside surface of the IC device die. The top-side portion of the device has vertical side walls with an etch profile obtained from a plasma etching process and the under-side portion of bulk material has vertical side walls with at least a partial profile obtained from a blade dicing process.

Further, in another embodiment, an integrated circuit device is manufactured by the methods described in the present disclosure.

The above summaries of the present invention are not intended to represent each disclosed embodiment, or every aspect, of the present invention. Other aspects and example embodiments are provided in the figures and the detailed description that follow.

BRIEF DESCRIPTION OF THE DRAWINGS

The disclosure may be more completely understood in consideration of the following detailed description of various embodiments of the invention in connection with the accompanying drawings, in which.

Figure 1:
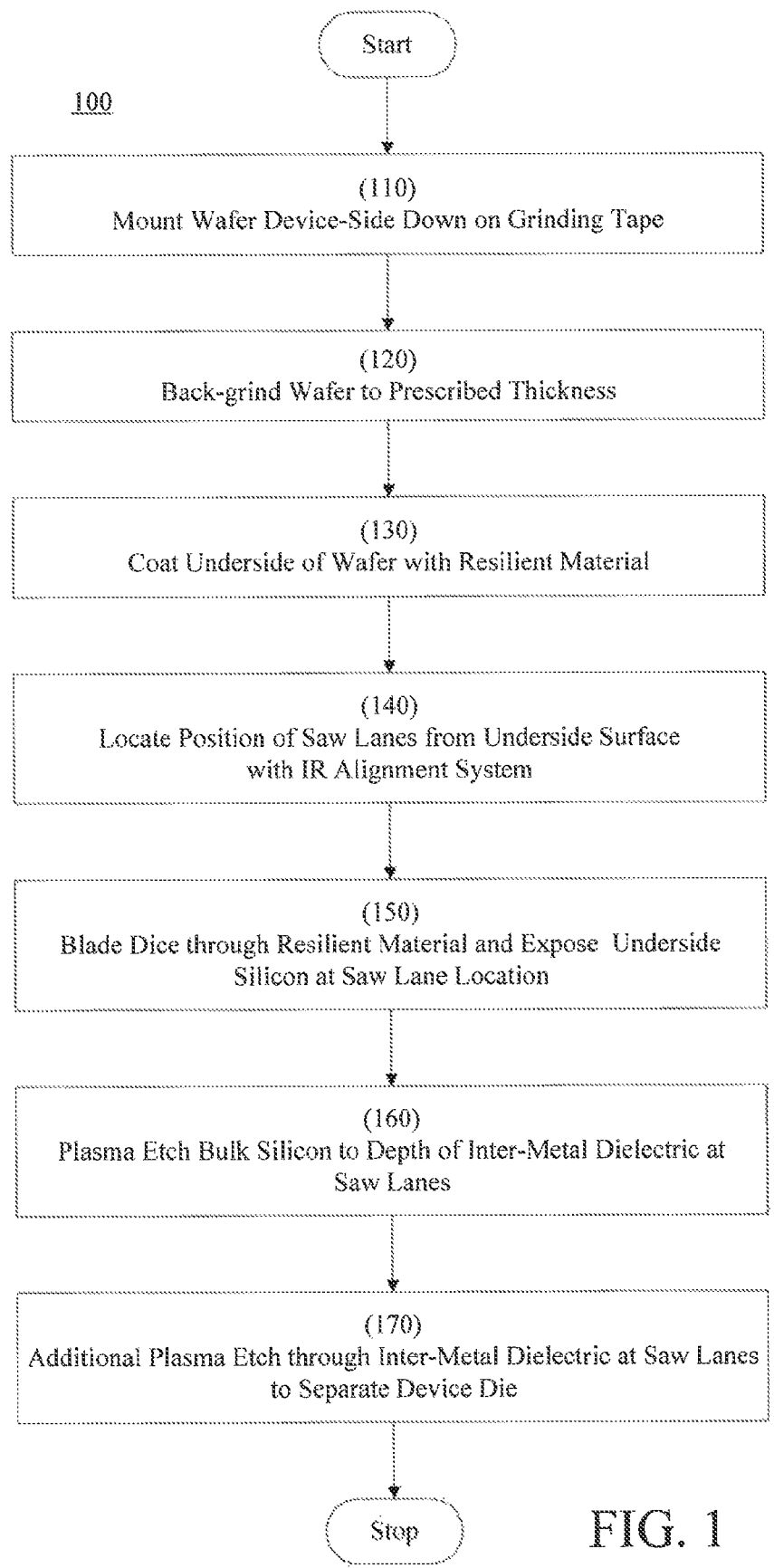
FIG. 1 is a flow diagram of process for preparing device die according to an embodiment of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

A number of processes used for wafer separation are using a mechanical method or laser to separate a silicon wafer into individual die. Example processes used in the industry have several shortcomings. These shortcomings become more critical for thin silicon, flexible applications (e.g. wearable electronics, card applications, flexible packages) and advanced CMOS nodes. Four example technologies in use include, mechanical blade dicing with rotating diamond blade, ablative laser dicing, laser grooving combined with blade dicing, and stealth laser dicing.

Mechanical blade dicing is a commonly used technique, however in some applications a device die separated from a wafer by mechanical blade dicing may have front-side and under-side chipping, damage on the side-walls (i.e., vertical faces) of the die leading to reduce die strength, for advanced CMOS materials, having multiple layers, delamination of these layers may occur.

Ablative laser dicing is a process of removing material from the silicon substrate by irradiating the surface (i.e., in a region of the saw lanes) with a laser beam. At a particular laser flux, the silicon substrate is heated by the absorbed laser energy and evaporates or sublimates. The process is more expensive for thicker wafer substrates. Owing to recast at the top of the kerf, die strength is significantly reduced. Further, a heat affected zone (HAZ) region is formed.

Laser Grooving in combination with blade dicing may perform a first cut by grooving with a laser followed by the diamond saw. The resulting separated device die may exhibit very low die strength due to recast at top of the kerf. A HAZ region may be formed. There is a potential risk of cracks and delamination, if process windows are not tightly controlled and matched. Further, sidewall cracks may form leading to moisture ingress into the die.

Stealth Laser Dicing may be used to separate the wafer. However, it may lead to thermal damage to the active circuits in the device die. The die may exhibit reduced fracture strength. For thicker substrates, the process may not be cost-justified and be too expensive.

Another technique, plasma dicing (PD) is a separation process that has been developed to overcome afore-mentioned quality related challenges. A reactive chemical plasma is used to etch trenches selectively into the area between the products, thereby separating them. The mechanical quality of the die and its sidewalls are far better, than with all other methods, since plasma dicing is not a mechanical, but a chemical separation process. It leaves the silicon crystal structure intact and thus maintains high robustness of the die. Chipping does not occur. Additionally, even rounded die corners are possible, by using masks with rounded die corners.

However, there are several reasons, why plasma dicing may not be suitable. The process requires an expensive mask to delineate those areas to be etched from those not etched. Since the plasma can also affect the products themselves, the sensitive area of the wafer needs to be covered by protective masks, to prevent etching in areas, which are not supposed to be etched. A substantial number of processes use photolithography to pattern the etching mask. Further, lithography is expensive and normally not available on-site at the package assembly location.

There are limitations regarding materials that can be separated by plasma dicing. A number of applications, for example, in the mobile device, power device, automotive and other domains use materials, which are deposited on the wafer back-side. These materials either do not etch well in the processes used for plasma dicing or they need similar chemistry as the masking material (organic). In this case, a clear selectivity between the material that needs to be etched and the masking material is not given. The chemistry of the masking material must be sufficiently different from chemistry of the underlying material to be etch so as to faithfully reproduce the features of the mask. A poorly selective etch removes both the desired material and underlying/overlying material that one wishes to remain intact. A highly selective etch leaves the underlying/overlying material unharmed; in this case the masking.

The embodiments outlined in the present disclosure have been found useful in addressing the shortcomings of the plasma dicing process discussed previously. A wafer substrate containing active devices on a top-side surface undergoes a back-grinding on its opposite underside surface; the wafer substrate is ground thinner. A back-side coating is applied to the thinned wafer. With an alignment system (i.e., infrared "IR") that can see through the underside surface to the top-side surface, a mechanical dicing blade is guided to the saw lanes between the active devices. The mechanical dicing blade makes a cut through the back-side coating and a partial cut through the underside surface into the silicon material. The cut back-side coating serves as a mask so that a first plasma etch may remove the undesired silicon. The first plasma etch etches the silicon to a depth of to expose the inter-metal dielectric (IMD) layers in the saw lanes between the undersides of the active devices. An additional plasma etches through the IMD layer until the actives devices are separated into individual device die.

Refer to FIG. 1. In an embodiment according to the present disclosure, a process 100 prepares the wafer substrate. At step 110, a wafer having active device die on its top-side surface is mounted device-side down onto a grinding tape. The wafer undergoes a back-grinding to a prescribed thickness in step 120. For example, a wafer thickness for a 200 mm ("8 inch" with pre-grind thickness of about 725 µm), after back-grind, is about 150 µm to about 360 µm. For a 300 mm ("12 inch" with a pre-grind thickness of about 775 µm), after back-grind, a wafer thickness is in the range of about 225 µm to about 360 µm. Table 1 shows some example thickness of various sizes of wafer substrates.

TABLE 1

Wafer Substrate Thicknesses to be Thinned

| Wafer Size (Silicon Substrate) | Pre-Grind Thickness (µm) | Range of Post-Grind Thickness (µm) |
|---|---|---|
| 5-inch (130 mm) or 125 mm (4.9 inch). | 625 | 30 µm to 350 µm |
| 150 mm (5.9 inch, usually referred to as "6 inch"). | 675 | 30 µm to 350 µm |
| 200 mm (7.9 inch, usually referred to as "8 inch"). | 725 | 30 µm to 350 µm |
| 300 mm (11.8 inch, usually referred to as "12 inch"). | 775 | 30 µm to 350 µm |
| 450 mm (17.7 inch, usually referred to as "18 inch"). | 925 (expected). | 30 µm to 350 µm |

In step 130, the underside surface of the back-ground wafer substrate is coated with a resilient coating. In an example process, through a lamination or printing process, the resilient coating of about 100 µm to about 300 µm is applied to the back-side of the wafer substrate 130. The resilient coating may be an organic polymer-based coating, such as an epoxy molding compound or an epoxy-based back-side coating material. Silicone-based materials may be suitable, as well. The resilient coating, may also be made of, but not necessarily limited to, KAPTON®, PTFE (polytetrafluoroethylene), and other types of molding compound, etc. KAPTON is the brand name of the polyimide film (i.e., poly-oxydiphenylene-pyromellitimide) manufactured by the E.I. du Pont de Nemours and Company. Other flexible protective materials may include, but not necessarily limited to, polytetra-fluoroethylene. Some molding compounds, may include, but not necessarily limited to, those manufactured by Sumitomo (e.g.: x84194) and Hitachi (e.g.: cel 400 ZHF 40 53 C), etc. The resilient material may be epoxy-based. In another example process, a spin-on silicone-based coating may be used.

In another example embodiment, the resilient coating may be a metallization coating the underside surface of the back-ground wafer substrate. Some underside metals may include, but not necessarily limited to, chromium (Cr), nickel (Ni), gold (Au), silver (Ag), aluminum (Al), titanium (Ti), vanadium (V) and alloys thereof, such as TiNiAg. The metallization may be in multiple layer stack in which the first layer is a layer to silicon wafer forming a good ohmic contact (e.g., Au, Au alloys, Al, Ti). As part of a multi-layer stack, an additional barrier and adhesion layer of chromium (Cr) and titanium (Ti) may be used. Furthering the stack, a solder layer may include Ag, Au, Ni, or NiV.

In one example embodiment, the silicon wafer substrate may be thinned to about 30 um. A coating of about 30 μm to about 150 μm of poly-benzyl methacrylate is applied to the under-side of the wafer substrate. In another example embodiment, the coating thickness range may be about 30 μm to about 200 μm.

In step 140, the position of the saw lanes is located with an infra-red (IR) scanning and alignment system. Having located the saw lanes from the underside of the now-coated wafer, with a mechanical blade dicing (i.e., "diamond saw"), the blade slices through the resilient material and exposes bulk silicon, in step 150. At step 160, the partially sliced wafer substrate undergoes a plasma etch of the exposed bulk silicon. The resilient material functions as a mask to protect those features not being etched. Etching is performed until inter-metal dielectric is exposed on the underside exposed. At step 170, additional plasma etch through the inter-metal dielectric at the saw lanes proceeds until the active device die are separated into individual devices.

Figure 2:
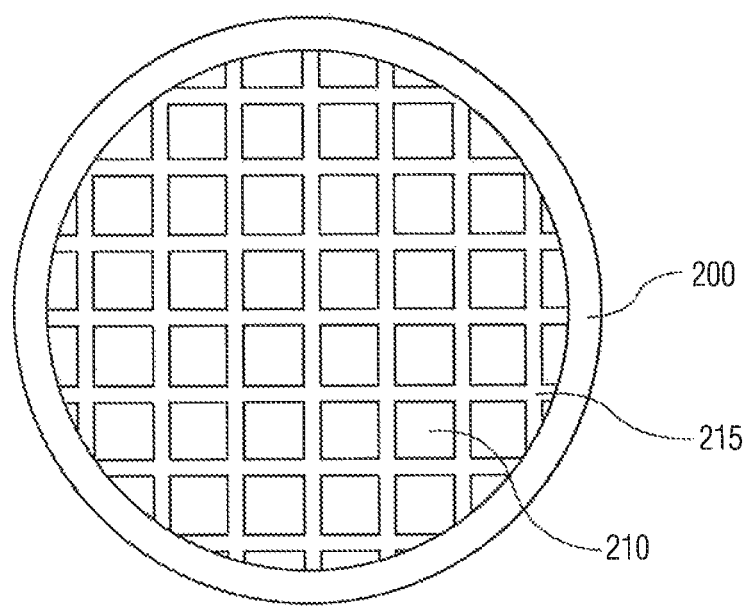
FIG. 2 is an example wafer substrate having active device die to be prepared according to an embodiment of the present disclosure.

Refer to FIG. 2. Delivered from the wafer fab, a wafer substrate 200 on a topside surface has a plurality of active device die 210 separated by saw lanes 215.

Figure 3A:
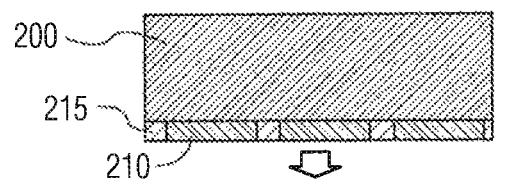
FIGS. 3A-3H is a series of side views of the wafer substrate of FIG. 2 being prepared according an embodiment of the present disclosure.
Figure 3B:
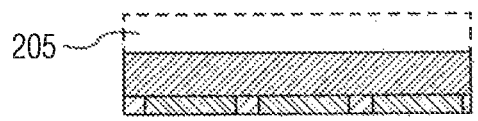

Refer to FIGS. 3A-3B. The wafer substrate 200 of FIG. 2 is prepared according to an embodiment of the present disclosure. The wafer 200 may be mounted onto a grinding tape (not illustrated) and undergo a back grind process which removes a prescribe amount of material 205. In an example embodiment, dependent upon the application, a back grind thickness may be 300 μm, 150 μm, 120 μm, or 75 μm or thinner.

Figure 3C:
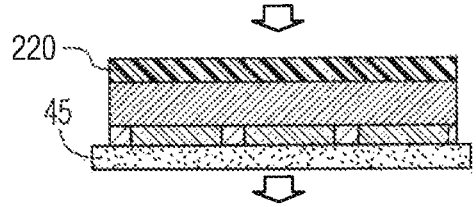

Refer to FIG. 3C. Before the dicing, the wafer needs to be mounted on a frame carrier (not illustrated), to support the structure after separation of the wafer into dies. The frame carrier holds a dicing tape 45 in tension. Dicing tape and frame are the most common methods. In other example embodiments, other carrier systems (e.g., glass carrier, carrier wafer or moveable chucks) may be used as well. In an example embodiment, the wafer is mounted face-down onto the dicing tape.

Wafer 200 is mounted onto a dicing tape 45 and the wafer receives an underside coating 220. The underside coating may be applied by lamination, spin-on, sputter or similar process.

Figure 3D:
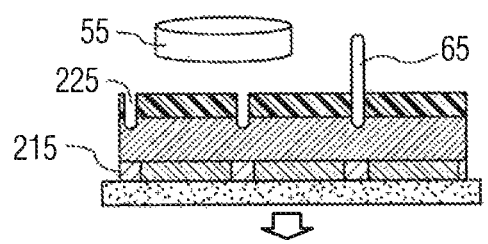

Refer to FIG. 3D. Trenches are opened in the backside coating material, to later allow access of the plasma to the wafer to be etched. Since the wafer pattern (active device die) is not visible from the back-side, an infra-red (IR) alignment system is needed to be able to align the trench opening kerf with the top-side active device die pattern.

For materials, that are not transparent to IR light, alternatively a system with alignment camera in the chuck can be used (such systems are e.g. available for Backside-Mask-Aligners. Some IR-opaque materials used for backside coating, though not necessarily limited, are metals, polymer films (e.g., "black coating) such as epoxy, metals (e.g., gold, etc.), film on wire materials, die-attach materials, etc.

With an IR alignment apparatus 55, a dicing blade 65 having a kerf, is guided to slice through the underside coating 220 in areas defined by saw lanes 215, to define a trench 225 that exposes the bulk silicon of the wafer 200.

To facilitate the separation of the underside coating, the saw lane cut depth can partly extend into the silicon. It is also possible to further extend the depth of the cut into the silicon to reduce the thickness of the remaining silicon for plasma etching.

Figure 3E:
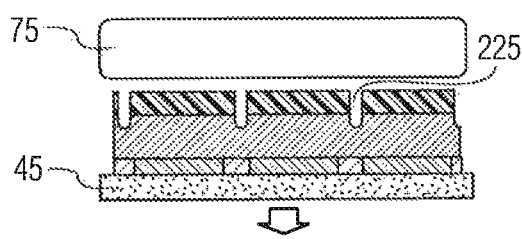

Refer to FIG. 3E. In a first plasma etch, with a plasma etching apparatus 75, the exposed bulk silicon in the trench 225 is etched. The underside coating 220 serves as a mask and prevent the etching of bulk silicon situated underneath active device die 210. The etch proceeds to a depth such that the inter-metal dielectric layer 235 (in the saw lane areas 215). The substrate silicon is etched by a suitable process (typically fluoride-chemistry, e.g. $SF_6$). Depending on speed and desired aspect ratio, a Bosch-Process Deep Reactive Ion Etching (DRIE) may be preferable.

Figure 3F:
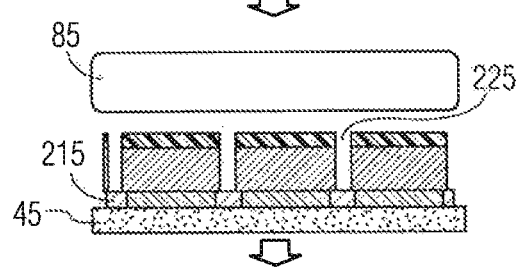

Refer to FIG. 3F. Depending upon the saw lane content, an additional plasma etching process may be prescribed. Different process may be required, to remove the IMD material from the scribe-lane and completely separate. Metal in the scribe should either be avoided or made small enough and isolated from the devices, so it will remain in the scribe lane, where it sticks to the tape during wafer flip and is thus removed.

Figure 3G:
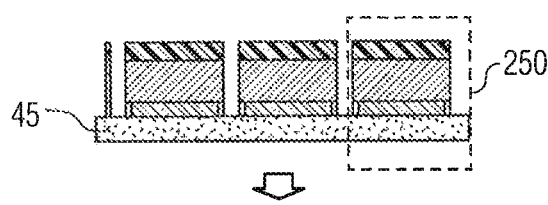

Refer to FIG. 3G. The additional etch proceeds to cut through the IMD layer 25 so as to separate the active device die 210 into individual devices 250.

If the resilient coating is not supposed to stay on the wafer, an additional process step for removing the coating may be considered (e.g. Oxide-Etch for organic coatings). For metal resilient coatings, in an example process, it may be preferable to leave the metallization on the underside surface. If metallization removal is desired, a suitable etching chemistry appropriate to the type of metal, has to be used.

Figure 3H:
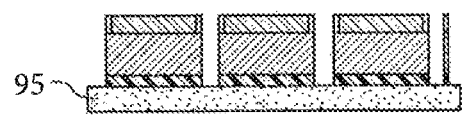

Refer to FIG. 3H. With a wafer-flip and remount the individuals devices 250 active device die surface are turned face-up. The wafer can be re-mounted to a new carrier, in a second dicing-tape 95 on a frame. The second dicing-tape 95 is mounted to the backside and the dicing tape 45 and from the front-side is removed. During the remount, it is also possible to stretch the original dicing tape 45, to increase the distance between the separated dies 250 so as to improve the pick-up performance to facilitate device die handling during assembly. A larger distance between individual device die 250 means a lower risk of damage by inadvertent touching of adjacent die with pick-up tooling.

The resulting device die would have a device with circuit elements with an area of the separated saw lane boundary (that separated adjacent devices on the wafer substrate). There would be a top-side portion of the device with circuit elements, surrounded by a saw lane boundary. The active circuits would have a depth of at least a thickness of inter-metal dielectric (IMD) layers or more. Below the active circuits would be an under-side portion of bulk material extending from the IMD layers to an underside surface of the device die. The device die would have vertical sidewalls. The vertical sidewalls in the top-side portion of the device would have an etch profile characteristic of a plasma etching process. The vertical sidewalls in the under-side portion of bulk material would have a profile characteristic of a blade dicing process. At a boundary between each portion there would likely be a transition zone between material that had undergone blade dicing and material that was subjected to a plasma etch.

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompasses inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the disclosure will be apparent to persons skilled in the art without departing from the spirit and scope of the disclosure as defined in the appended claims.

The invention claimed is:

1. A method for preparing an integrated circuit (IC) device from a wafer substrate, the wafer substrate having a top-side surface with a plurality of active device die separated by saw lanes and an opposite under-side surface, the method comprising:
    coating the under-side surface of the wafer substrate with a resilient material;
    locating the position of the saw lanes from the underside surface;
    blade dicing trenches in the resilient material to expose under-side bulk material in the position of the saw lanes;
    plasma etching with a first etch through the trenches to remove the exposed under-side bulk material from the under-side surface to a depth of inter-metal dielectric (IMD) layers present in the saw lanes at the top-side surface; and
    plasma etching with a second etch through the trenches to remove the exposed IMD layers at the top-side surface until the plurality of active device die are separated into individual device die, the plasma etching with the first and second etches thereby producing an etch profile characteristic of a plasma etch process.

2. The method as recited in claim 1, further comprising, back-grinding the under-side surface of the wafer substrate prior to the coating the under-side surface.

3. The method as recited in claim 1, further comprising, etching with a third etch to remove the resilient coating from the underside surfaces of the individual device die.

4. The method as recited in claim 1, wherein blade dicing trenches is done to a depth into the under-side bulk material to reduce a thickness of a remaining portion of the under-side bulk material over the inter-metal dielectric (IMD) layers.

5. The method as recited in claim 1,
    wherein the resilient material is transparent to infra-red light; and
    wherein locating the position of the saw lanes is performed with an alignment apparatus using infra-red light transmitting through the resilient material.

6. The method as recited in claim 1, wherein locating the position of the saw lanes is performed with an alignment apparatus using pattern recognition of the topside surface of the wafer substrate.

7. The method as recited in claim 1, wherein the resilient material is an organic polymer material.

8. The method as recited in claim 1, wherein the resilient material is an underside metallization.

9. The method as recited in claim 1, further comprising, mounting the top-side surface of the wafer substrate to a first dicing tape prior to the coating the under-side surface.

10. The method as recited in claim 9, further comprising, mounting the under-side surface of the wafer substrate to a second dicing tape after the plurality of device die are separated into individual die.

11. The method as recited in claim 10, wherein the wafer substrate is mounted face-down onto the first dicing tape and the wafer substrate is mounted face-up onto the second dicing tape.

12. The method as recited in claim 10, further comprising:
    stretching the first dicing tape to increase a distance between the individual device die, prior to the mounting the under-side surface to the second dicing tape, and
    removing the first dicing tape after the mounting the under-side surface to the second dicing tape.

13. The method as recited in claim 1, wherein the resilient material is an organic polymer layer.

14. The method as recited in claim 1, where in the resilient material is a metallization.

* * * * *